United States Patent [19]
Flynn

[11] Patent Number: 5,764,173
[45] Date of Patent: Jun. 9, 1998

[54] DIGITAL TO ANALOGUE CONVERTER HAVING INPUT CONTROL BITS FOR SELECTING A PULSE WIDTH MODULATED OUTPUT SIGNAL

[75] Inventor: David Walter Flynn, Cambridge, United Kingdom

[73] Assignee: Advanced RISC Machines Limited, Cambridge, United Kingdom

[21] Appl. No.: 715,495

[22] Filed: Sep. 18, 1996

[30] Foreign Application Priority Data

May 7, 1996 [GB] United Kingdom ............... 9609489

[51] Int. Cl.$^6$ .......................... H03M 1/66; H03M 1/82
[52] U.S. Cl. .................. 341/152; 341/144; 341/153; 341/154
[58] Field of Search ................. 375/238; 341/144, 341/145, 146, 152

[56] References Cited

U.S. PATENT DOCUMENTS

| | | | |
|---|---|---|---|
| 3,653,035 | 3/1972 | Carbrey | 341/108 |
| 4,484,178 | 11/1984 | Lovgren et al. | 341/153 |
| 5,539,408 | 7/1996 | Tani et al. | 341/144 |

FOREIGN PATENT DOCUMENTS

| | | |
|---|---|---|
| 0 097 249 | 1/1984 | European Pat. Off. . |
| 0141386 A2 | 10/1984 | European Pat. Off. . |
| 0 132 622 | 2/1985 | European Pat. Off. . |
| 0280277 A2 | 2/1988 | European Pat. Off. . |

Primary Examiner—Jeffrey A. Gaffin
Assistant Examiner—Kim Huynh
Attorney, Agent, or Firm—Nixon & Vanderhye P.C.

[57] ABSTRACT

A digital to analogue converter having a plurality of output stages 46. Each output stage 46 includes a tri-state buffer 54 that outputs an on-signal, an off-signal or a pulse width modulated signal PWM that is selected by a multiplexer 52 that operates under control of a chord decoder 50 that is responsive to exponent bits within the input digital signal value. If a pulse width modulated signal is selected, then its duty cycle is controlled by a pulse width modulated decoder 48 that is responsive to mantissa bits within the input digital signal value. A further output provides a pulse width modulated signal of a predetermined duty cycle that may be used as a reference signal to compensate for variations in the operation of the rest of the digital to analogue circuit.

16 Claims, 17 Drawing Sheets

| EXP | EN[3] | EN[2] | EN[1] | EN[0] |
|-----|-------|-------|-------|-------|
| 0 0 | 0 | 0 | 0 | PWM |
| 0 1 | 0 | 0 | PWM | 1 |
| 1 0 | 0 | PWM | 1 | 1 |
| 1 1 | PWM | 1 | 1 | 1 |

Fig. 5

| Sign | EXP | Mantissa | Iout[3] | Iout[2] | Iout[1] | Iout[0] | Itot |
|---|---|---|---|---|---|---|---|
| 1 | 11 | 11111 | -256 | -128 | -64 | -32 | -480 |
| 1 | 11 | (m) | -(m+1)*8 | -128 | -64 | -32 | -(224+((m+1)*8)) |
| 1 | 11 | 00000 | -8 | -128 | -64 | -32 | -232 |
| 1 | 10 | 11111 | 0 | -128 | -64 | -32 | -224 |
| 1 | 10 | (m) | 0 | -(m+1)*4 | -64 | -32 | -(96+((m+1)*4)) |
| 1 | 10 | 00000 | 0 | -4 | -64 | -32 | -100 |
| 1 | 01 | 11111 | 0 | 0 | -64 | -32 | -96 |
| 1 | 01 | (m) | 0 | 0 | -(m+1)*2 | -32 | -(32+((m+1)*2)) |
| 1 | 01 | 0 | 0 | 0 | -2 | -32 | -34 |
| 1 | 00 | 11111 | 0 | 0 | 0 | -32 | -32 |
| 1 | 00 | (m) | 0 | 0 | 0 | -(m+1) | -(m+1) |
| 1 | 00 | 00000 | 0 | 0 | 0 | -1 | -1 |

Fig. 6a

| Sign | EXP | Mantissa | Iout[3] | Iout[2] | Iout[1] | Iout[0] | Itot |
|---|---|---|---|---|---|---|---|
| 0 | 00 | 00000 | 0 | 0 | 0 | +1 | +1 |
| 0 | 00 | (m) | 0 | 0 | 0 | +(m+1) | +(m+1) |
| 0 | 00 | 11111 | 0 | 0 | 0 | +32 | +32 |
| 0 | 01 | 00000 | 0 | 0 | +2 | +32 | +34 |
| 0 | 01 | (m) | 0 | 0 | +(m+1)*2 | +32 | +(32+((m+1)*2)) |
| 0 | 01 | 11111 | 0 | 0 | +64 | +32 | +96 |
| 0 | 10 | 00000 | 0 | +4 | +64 | +32 | +100 |
| 0 | 10 | (m) | 0 | +(m+1)*4 | +64 | +32 | +(96+((m+1)*4)) |
| 0 | 10 | 11111 | 0 | +128 | +64 | +32 | +224 |
| 0 | 11 | 00000 | +8 | +128 | +64 | +32 | +232 |
| 0 | 11 | (m) | +(m+1)*8 | +128 | +64 | +32 | +(224+((m+1)*8)) |
| 0 | 11 | 11111 | +256 | +128 | +64 | +32 | +480 |

Fig. 6b

| EXP | EN[7] | EN[6] | EN[5] | EN[4] | EN[3] | EN[2] | EN[1] | EN[0] |
|-----|-------|-------|-------|-------|-------|-------|-------|-------|
| 000 | 0 | 0 | 0 | 0 | 0 | 0 | 0 | PWM |
| 001 | 0 | 0 | 0 | 0 | 0 | 0 | PWM | 1 |
| 010 | 0 | 0 | 0 | 0 | 0 | PWM | 1 | 1 |
| 011 | 0 | 0 | 0 | 0 | PWM | 1 | 1 | 1 |
| 100 | 0 | 0 | 0 | PWM | 1 | 1 | 1 | 1 |
| 101 | 0 | 0 | PWM | 1 | 1 | 1 | 1 | 1 |
| 110 | 0 | PWM | 1 | 1 | 1 | 1 | 1 | 1 |
| 111 | PWM | 1 | 1 | 1 | 1 | 1 | 1 | 1 |

*Fig.11*

| Sign | EXP | Mantissa | Iout[7] | Iout[6] | Iout[5] | Iout[4] | Iout[3] |
|---|---|---|---|---|---|---|---|
| 1 | 111 | (m) | $-(m+1)*128$ | $-1024$ | $-512$ | $-256$ | $-128$ |
| 1 | 110 | (m) | 0 | $-(m+1)*64$ | $-512$ | $-256$ | $-128$ |
| 1 | 101 | (m) | 0 | 0 | $-(m+1)*32$ | $-256$ | $-128$ |
| 1 | 100 | (m) | 0 | 0 | 0 | $-(m+1)*16$ | $-128$ |
| 1 | 011 | (m) | 0 | 0 | 0 | 0 | $-(m+1)*8$ |
| 1 | 010 | (m) | 0 | 0 | 0 | 0 | 0 |
| 1 | 001 | (m) | 0 | 0 | 0 | 0 | 0 |
| 1 | 000 | (m) | 0 | 0 | 0 | 0 | 0 |
| 0 | 000 | (m) | 0 | 0 | 0 | 0 | 0 |
| 0 | 001 | (m) | 0 | 0 | 0 | 0 | 0 |
| 0 | 010 | (m) | 0 | 0 | 0 | 0 | 0 |
| 0 | 011 | (m) | 0 | 0 | 0 | 0 | $+(m+1)*8$ |
| 0 | 100 | (m) | 0 | 0 | 0 | $+(m+1)*16$ | $+128$ |
| 0 | 101 | (m) | 0 | 0 | $+(m+1)*32$ | $+256$ | $+128$ |
| 0 | 110 | (m) | 0 | $+(m+1)*64$ | $+512$ | $+256$ | $+128$ |
| 0 | 111 | (m) | $+(m+1)*128$ | $+1024$ | $+512$ | $+256$ | $+128$ |

Fig. 12a

| Sign | EXP | Mantissa | Iout[2] | Iout[1] | Iout[0] | Itot |
|---|---|---|---|---|---|---|
| 1 | 111 | (m) | -64 | -32 | -16 | -(2032+((m+1)*128)) |
| 1 | 110 | (m) | -64 | -32 | -16 | -(1008+((m+1)*64)) |
| 1 | 101 | (m) | -64 | -32 | -16 | -(496+((m+1)*32)) |
| 1 | 100 | (m) | -64 | -32 | -16 | -(240+((m+1)*16)) |
| 1 | 011 | (m) | -64 | -32 | -16 | -(112+((m+1)*8)) |
| 1 | 010 | (m) | -(m+1)*4 | -32 | -16 | -(48+((m+1)*4)) |
| 1 | 001 | (m) | 0 | -(m+1)*2 | -16 | -(16+((m+1)*2)) |
| 1 | 000 | (m) | 0 | 0 | -(m+1) | -(m+1) |
| 0 | 000 | (m) | 0 | 0 | +(m+1) | (m+1) |
| 0 | 001 | (m) | 0 | +(m+1)*2 | +16 | +(16+((m+1)*2)) |
| 0 | 010 | (m) | +(m+1)*4 | +32 | +16 | +(48+((m+1)*4)) |
| 0 | 011 | (m) | +64 | +32 | +16 | +(112+((m+1)*8)) |
| 0 | 100 | (m) | +64 | +32 | +16 | +(240+((m+1)*16)) |
| 0 | 101 | (m) | +64 | +32 | +16 | +(496+((m+1)*32)) |
| 0 | 110 | (m) | +64 | +32 | +16 | +(1008+((m+1)*64)) |
| 0 | 111 | (m) | +64 | +32 | +16 | +(2032+((m+1)*128)) |

Fig. 12b

| Input | PWM | Output | 0 | 1 | 2 | 3 | 4 | 5 | 6 | 7 | 8 | 9 | a | b | c | d | e | f |
|---|---|---|---|---|---|---|---|---|---|---|---|---|---|---|---|---|---|---|
| 0111 | 15/16 | +7/16 | − | + | + | + | + | + | + | + | + | + | + | + | + | + | + | + |
| 0110 | 14/16 | +6/16 | − | + | + | + | + | + | + | + | − | + | + | + | + | + | + | + |
| 0101 | 13/16 | +5/16 | − | + | + | + | − | + | + | + | − | + | + | + | + | + | + | + |
| 0100 | 12/16 | +4/16 | − | + | + | + | − | + | + | + | − | + | + | + | − | + | + | + |
| 0011 | 11/16 | +3/16 | − | + | − | + | − | + | + | + | − | + | + | + | − | + | + | + |
| 0010 | 10/16 | +2/16 | − | + | − | + | − | + | + | + | − | + | − | + | − | + | + | + |
| 0001 | 9/16 | +1/16 | − | + | − | + | − | + | − | + | − | + | − | + | − | + | + | + |
| 0000 | 8/16 | 0 | − | + | − | + | − | + | − | + | − | + | − | + | − | + | − | + |
| 1111 | 7/16 | −1/16 | − | − | − | + | − | + | − | + | − | + | − | + | − | + | − | + |
| 1110 | 6/16 | −2/16 | − | − | − | + | − | + | − | + | − | − | − | + | − | + | − | + |
| 1101 | 5/16 | −3/16 | − | − | − | + | − | − | − | + | − | − | − | + | − | + | − | + |
| 1100 | 4/16 | −4/16 | − | − | − | + | − | − | − | + | − | − | − | + | − | − | − | + |
| 1011 | 3/16 | −5/16 | − | − | − | − | − | − | − | + | − | − | − | + | − | − | − | + |
| 1010 | 2/16 | −6/16 | − | − | − | − | − | − | − | + | − | − | − | − | − | − | − | + |
| 1001 | 1/16 | −7/16 | − | − | − | − | − | − | − | − | − | − | − | − | − | − | − | + |
| 1000 | 0/16 | −8/16 | − | − | − | − | − | − | − | − | − | − | − | − | − | − | − | − |
| xxxx | 16/16 | +8/16 | + | + | + | + | + | + | + | + | + | + | + | + | + | + | + | + |

Fig. 13

DIGITAL TO ANALOGUE CONVERTER HAVING INPUT CONTROL BITS FOR SELECTING A PULSE WIDTH MODULATED OUTPUT SIGNAL

BACKGROUND OF THE INVENTION

1. Field of the Invention

This invention relates to digital to analogue converters.

2. Description of the Prior Art

Known digital to analogue converters include systems that incorporate a resister ladder, elements of which are selectively energised in response to the input digital signal value to yield a total output analogue signal of an appropriate size. It is also known to utilise pulse width modulation (PWM) techniques to perform digital to analogue conversion. With these PWM techniques, a pulse width modulated signal is generated with a duty cycle controlled by the input digital signal value. This pulse width modulated signal is then low pass filtered and an analogue signal is produced with a value dependent upon the duty cycle of the pulse width modulated signal.

Within the field of circuits including both digital and analogue portions, it is desirable that as much of the circuit as possible be implemented within the digital portion. The digital portions may be implemented as integrated circuits that are relatively inexpensive, compact and power efficient as well as comparatively immune to the tolerance problems of analogue circuits.

With a digital to analogue converter, there must at some stage be a conversion from digital circuitry to analogue circuitry. This interface produces a further constraint in that it is desirable that as few signal lines as possible should be used to connect the digital portion of the circuit to the analogue portion of the circuit. The reason for this is that the digital portion of the circuit will typically be implemented as an integrated circuit which has a much smaller size and a restricted available input/output connection count. Thus, the greater the number of connections required from the digital portion of the circuit to the analogue portion of the circuit, the less are the number of connections that are available to perform other functions that may be required of the digital circuit.

SUMMARY OF THE INVENTION

The present invention addresses the problem of providing an improved digital to analogue converter that allows an increased proportion of digital circuitry to be used and requires a low number of connections between the digital portion of the circuit and the analogue portion of the circuit.

Viewed from one aspect the present invention provides a digital to analogue converter for converting an input digital signal value to an output analogue signal, said digital to analogue converter comprising:

(i) a plurality of output stages each being responsive to said input digital signal value to generate a component signal that is one of an on signal having a signal amplitude, a pulse width modulated signal having said signal amplitude and an off signal, said on signal and said pulse width modulated signal for different output stages having different signal amplitudes and being coupled in parallel to a common summing node to generate a sum signal; and (ii) a low pass filter for low pass filtering any pulse width modulated component of said sum signal at said common summing node to generate said output analogue signal.

The invention utilises a plurality of output stages with different signal amplitudes with each stage being operable in an on/off manner or a pulse width modulation manner. This provides a high dynamic range with the pulse width modulation providing sufficiently fine resolution without needing an excessive number of output stages. The low pass filter is the only portion that need be analogue in nature so meeting the requirement that the digital to analogue converter be implemented primarily with a digital circuit.

In order to provide a high dynamic range that smoothly and effectively covers the range of output analogue signals that it is designed to use, it has been found preferable that said on signals and said pulse width modulated signals for different output stages have logarithmically related amplitudes.

Within a digital circuit, such a logarithmic relationship is simplified in implementation when said signal amplitudes increase by a factor of two between output values.

The relationship between the input digital signal value and the response of the digital to analogue converter to this may take many different forms. However, advantageously simplified embodiments of the invention are ones in which one or more chord bits of said input digital signal value control which of said output stages generate said on signal, which of said output stages generate said pulse width modulated signal and which of said output stages generate said off signal.

It would be possible for more than one of the output stages to simultaneously be producing a pulse width modulated component signal. However, the bit space (or time slots, where a bit represents a time slot) available to represent the input digital signal value is in itself at a premium. The amount of data of storage capacity required to store a digitally sampled representation of an analogue signal may be extremely high and accordingly the bit space within any given input digital signal value must be used to the maximum effect. Therefore, the invention, for a given input digital signal value, only one of said output stages is a pulse width modulated output stage that generates a pulse width modulated signal, any output stages with signal amplitude lower than said pulse width modulated output stage generating on signals and any output stages with signal amplitude higher than said pulse width modulated output stage generating off signals.

The bit space required to specify the duty cycle of a pulse width modulated signal to a meaningful degree is comparatively large compared to the bit space required to specify which output stages produce either on or off signals. Accordingly, it is desirable that only one output stage should be producing a pulse width modulated signal at any given time. Furthermore, achieving the required dynamic range within the analogue signal amplitude necessitates that the lower order output stages be on to provide a bias on top of which the pulse width modulated signal provides an additional degree of fine control and improves monotonicity.

In accordance with the above, it is preferred that a plurality of control field bits of said input digital signal value select a duty cycle for said pulse width modulated signal.

It is desirable that the digital to analogue converter should be able to produce both polarities of analogue signal and accordingly, it is preferred that a sign bit of said input digital signal value selects the polarity of said output analogue signal.

The low pass filter may be implemented in many different ways. One problem that can arise is the effect of thermal drift and manufacturing tolerances within the digital circuitry upon the driving of the low pass filter that may result in variations in the absolute value of the output analogue signal. Preferred embodiments of the invention that reduce this problem are ones in which said low pass filter includes a differential amplifier, a reference input to said differential amplifier being a reference voltage derived from a reference signal of a predetermined duty cycle.

The combination of the use of a differential amplifier that is corrected with a reference voltage that is itself derived from a reference signal with a predetermined duty cycle is that variations in the component signals produced by the output stages will be accompanied by corresponding changes in the reference signal that will serve to cancel out one another.

A simple, effective and inexpensive way of controlling the signal amplitudes of the different output stages is that each output stage includes a resistive element to control said signal amplitudes for said output stage.

The variation between the signal amplitudes of different stages may be more accurately controlled when said resistive elements are formed of one or more resistors having a common resistance value and originating from a common manufacturing batch.

Whilst the invention provides advantages of compactness, high dynamic range and high resolution in many different implementations, the invention provides particularly strong advantages in embodiments in which other than said resistive elements and said low pass filter, said digital to analogue converter comprises a digital integrated circuit.

In order to effectively drive the different types of component signal to the common summing mode, it is preferred that each output stage includes a tri-state buffer that generates said component signal.

The pulse width modulation pattern chosen could take many forms. Generally speaking, a transition in state of a signal consumes power. Reducing power consumption is regarded as a desirable goal since it enables longer operation of portable devices and reduces heat build up. However, in order to improve the effectiveness of the low pass filter and the fidelity of the output analogue signal it is preferred that said pulse width modulated signal has the lowest low frequency Fourier component content for a required duty cycle and oversampling frequency of said pulse width modulated signal.

The digital to analogue converter of the present invention may be used with input digital signal values representing many different physical entities. However, the invention is particularly useful when said input digital signal value is a digital audio sample and said output analogue signal drives an audio transducer.

Viewed from another aspect the invention also provides a digital to analogue conversion method for converting an input digital signal value to an output analogue signal, said digital to analogue conversion method comprising the steps of:

(i) in response to said input digital signal value in each of a plurality of output stages generating a component signal that is one of an on signal having a signal amplitude, a pulse width modulated signal having said signal amplitude and an off signal, said on signal and said pulse width modulated signal for different output stages having different signal amplitudes and being coupled in parallel to a common summing node to generate a sum signal; and (ii) low pass filtering any pulse width modulated component of said sum signal at said common summing node to generate said output analogue signal.

The above, and other objects, features and advantages of this invention will be apparent from the following detailed description of illustrative embodiments which is to be read in connection with the accompanying drawings.

BRIEF DESCRIPTION OF THE DRAWINGS

FIG. 5 illustrates the chord-steering in relation to differing chord selecting bits for the system of FIGS. 1, 2 and 3;

FIGS. 6a and 6b illustrate the mapping between input digital signal values and output analogue signals for the system of FIGS. 1, 2 and 3;

FIG. 11 illustrates the chord-steering in relation to differing chord selecting bits for the system of FIGS. 7, 8 and 9;

FIGS. 12a and 12b illustrate the mapping between input digital signal values and output analogue signals for the system of FIGS. 7, 8 and 9;

FIG. 13 illustrates the pulse width modulation encoding for different mantissa values of the input digital signal value of FIG. 7;

DESCRIPTION OF THE PREFERRED EMBODIMENTS

Figure 1:
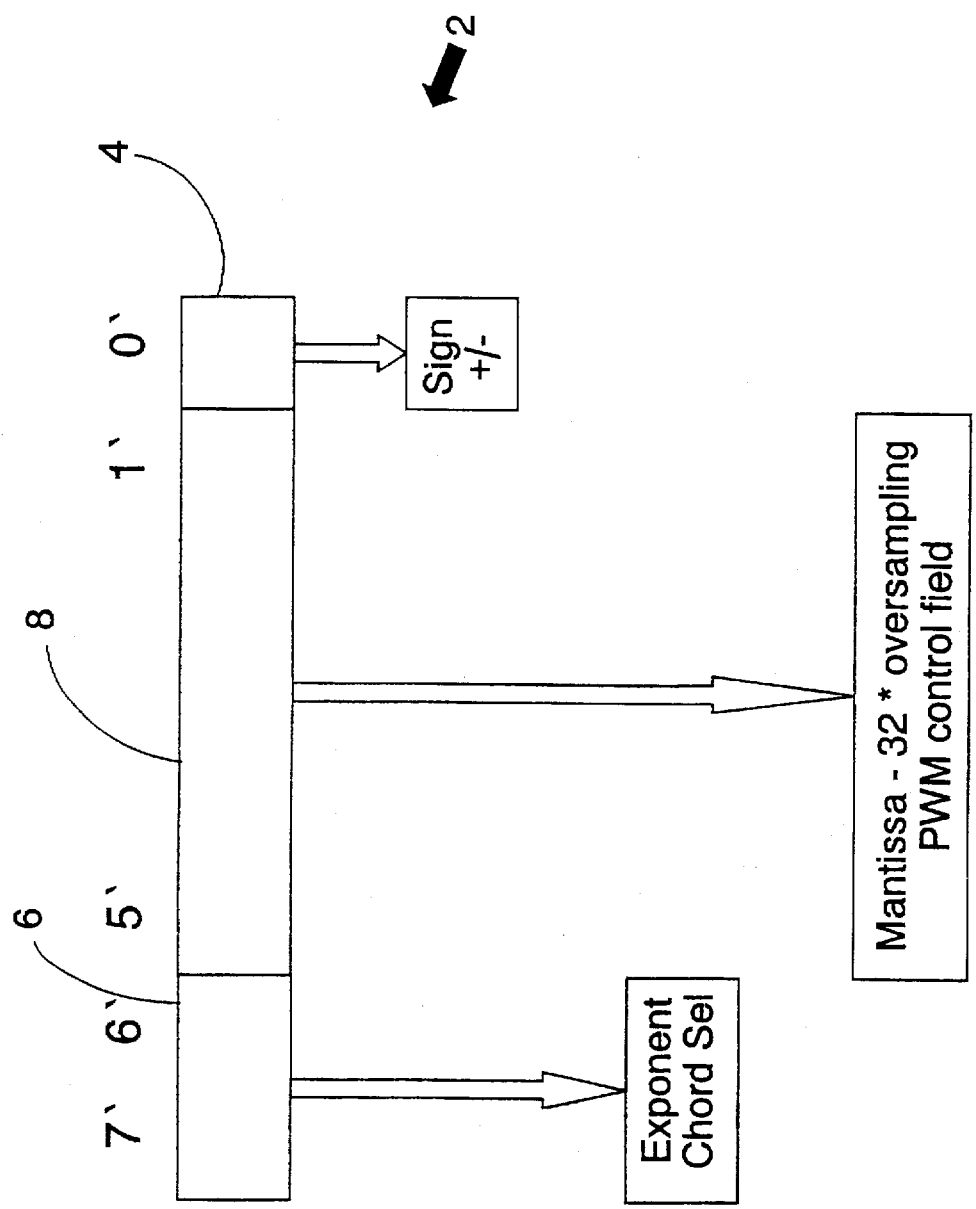
FIG. 1 illustrates the format of one embodiment of an input digital signal value.

FIG. 1 illustrates an input digital signal value 2. The input digital signal value 2 is composed of a sign bit 4, two chord selecting (exponent) bits 6 and five control field (mantissa) bits 8. The sign bit 4 (shown as 0') controls the polarity of the output analogue signal produced by the digital to analogue converter. The chord selecting bits 6 (shown as 6' and 7') control which of the output stages of the digital to analogue converter produce on signals, off signals or pulse width modulated signals. This corresponds to selecting a particular chord upon the characteristic illustrated in FIG. 4 on which the output analogue signal lies. The control field bits 8 control the duty cycle of the pulse width modulated signal produced by one of the output stages of the digital to analogue converter. This corresponds to specifying a position along the chord in FIG. 4 that has been selected by the chord selecting bits (1'–5') 6. The five bits of the control field bits 8 allow thirty two different duty cycles to be specified.

Figure 2:
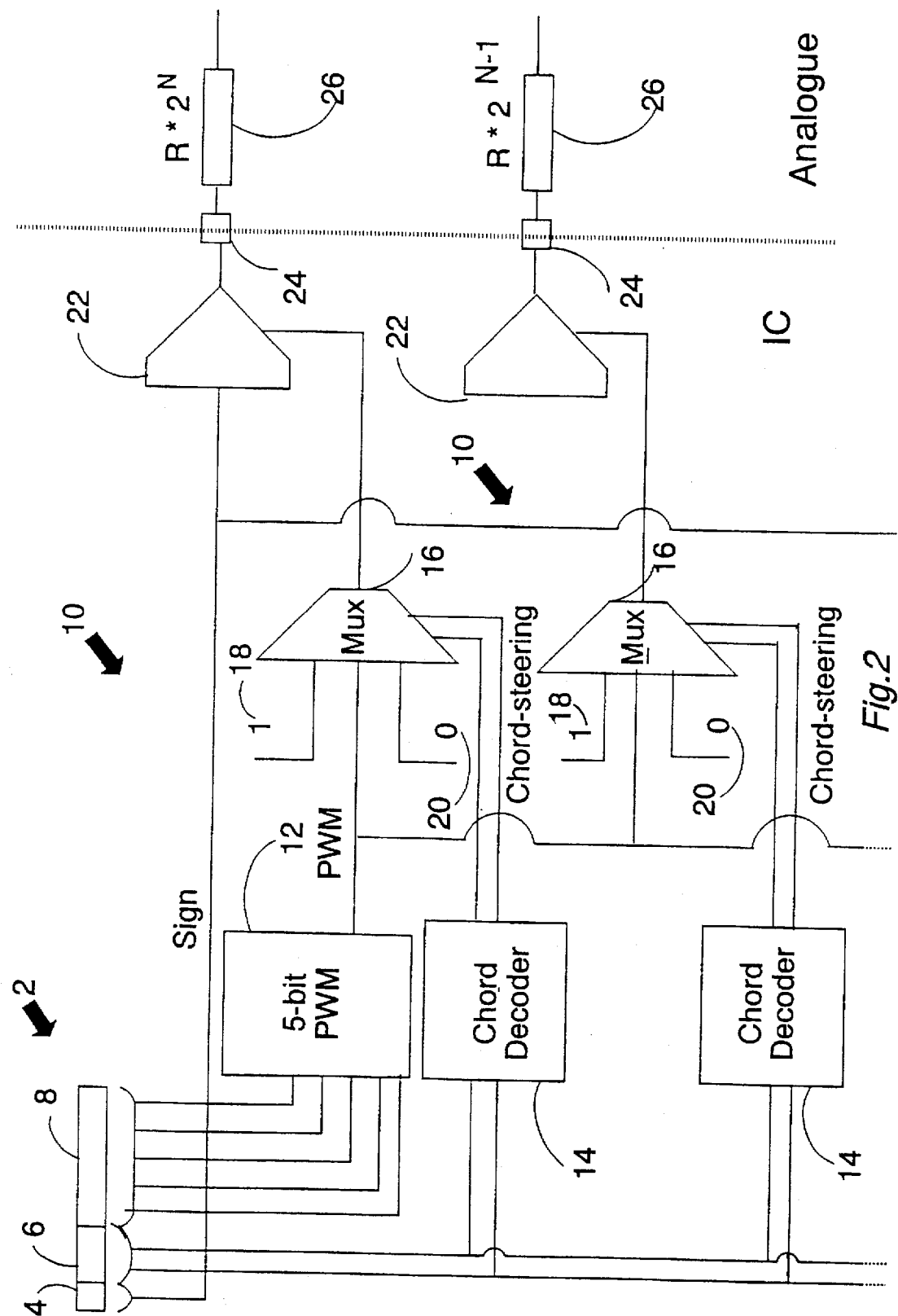
FIG. 2 illustrates two output stages for digital to analogue converting the input digital signal value of FIG. 1.

FIG. 2 illustrates two of the output stages 10 of the digital to analogue converter. A 5-bit pulse width modulating decoder (in fact shared between all the output stages) 12 converts the control field bits 8 to a pulse width modulated signal PWM having one of 32 possible duty cycles. Control field bits 00000 produce a duty cycle of 16/32. Control field bits 01111 produce a duty cycle of 31/32 with the intervening control field bit numbers between 00001 and 01110 producing the duty cycles 17/32 to 30/32. The control field bits 10000 produce a duty cycle of 0/32. The control field bits 11111 produce a duty cycle of 15/32 with the intervening control field bits between 10000 and 11111 producing the duty cycles 1/32 to 14/32.

A chord decoder 14 is responsive to the chord selecting bits 6 to produce a chord-steering output that it is supplied to a multiplexer 16. Depending upon the content of the chord selecting bits 6, the chord decoder 14 controls the multiplexer 16 by the chord-steering bits to select one of an on-signal 18, an off-signal 20, and the pulse width modulated signal for output by the multiplexer 16. The mapping of the chord selecting bits 6 to the chord-steering signal will differ for different output stages such that for any given chord selecting bits, one of the multiplexers will select the Pulse Width Modulated signal, the higher order multiplexers will select the on-signal 18 and the lower order multiplexers will select the off-signal 20.

The sign bit 4 provides the input to a tri-state buffer 22. The tri-state buffer 22 is gated by the output of the multiplexer 16 and supplies its output to an output pad 24 of an integrated circuit. The components to the left of the output pad 24 in FIG. 2 are all part of an integrated circuit. The signal from the output pad 24 is then passed to a resistive element 26 that has a particular value depending upon the order of the output stage. The resistive element 26 is formed of a network of resisters of the same value and from the same manufacturing batch. In this way, an accurate logarithmic relationship between the resistance values of respective resistive elements 26 in different output stages 10 can be achieved.

Figure 3:
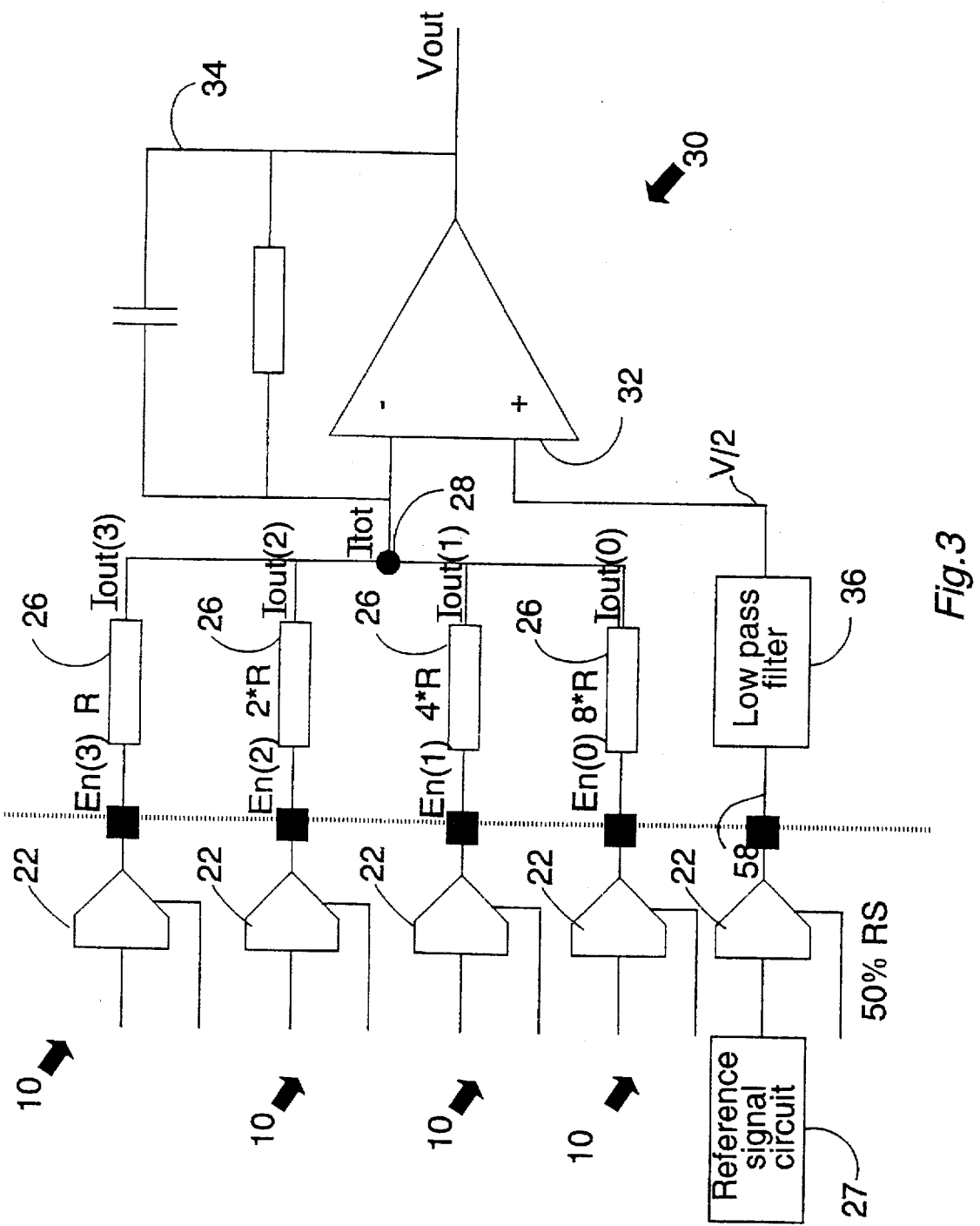
FIG. 3 illustrates the end portions, i.e., tristate buffers, of a set of output stages as illustrated in FIG. 2 in combination with a low pass filter.

FIG. 3 illustrates a digital to analogue converter having four output stages 10 (two of which are illustrated in FIG. 2). These output stages 10 are connected via respective resistive elements 26 to a common summing node 28. The common summing node 28 passes its output to a low pass filter 30 that comprises a differential amplifier 32 with a feedback network 34. A reference voltage V/2 is fed to the non-inverting input of the differential amplifier 32 and the sum of the component signals from the respective output stages 10 is supplied from the common summing node to the inverting input of the differential amplifier 32. The feedback network 34 has component values chosen in accordance with standard practice to produce a low pass filtering characteristic with a cut off frequency substantially lower than the lowest Fourier component of the pulse width modulated signal.

The reference voltage V/2 is derived from a reference signal circuit 27 via further output pad of the integrated circuit (having an identical tristate output buffer to the output stages such that manufacturing differences in the tristate output buffers may be corrected) which produces a reference signal RS having a 50% duty cycle that is then passed through a reference signal low pass filter 36 to yield the reference voltage V/2. In this way, variations in the absolute magnitude of the signals produced by the integrated circuit, such as due to changes in the rail voltage, are compensated for since the same changes will occur in the reference voltage V/2 which is used as a reference point by the differential amplifier 32.

Figure 4:
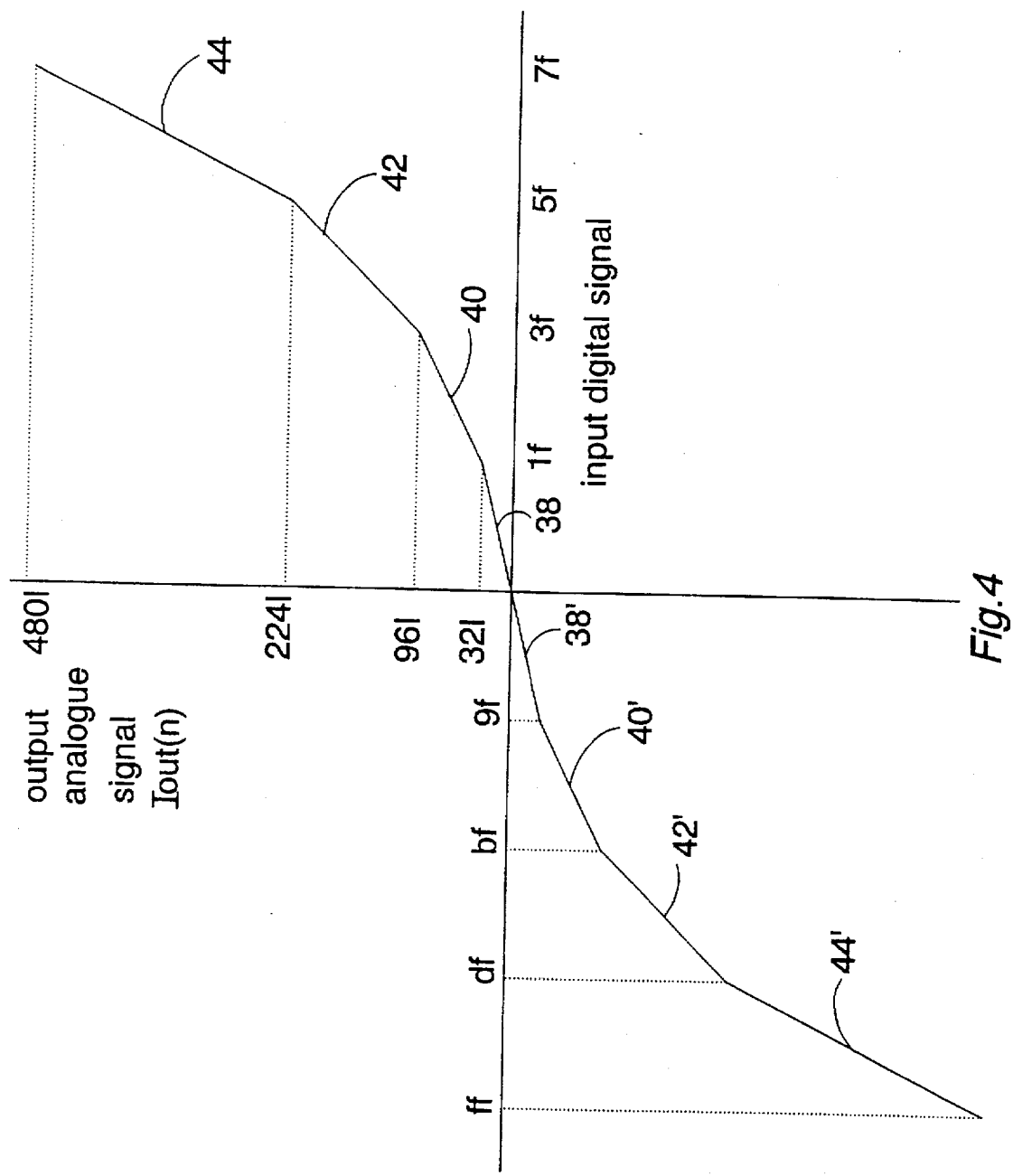
FIG. 4 illustrates the digital to analogue characteristic of the system of FIGS. 1, 2 and 3.

FIG. 4 illustrates the digital to analogue characteristic of the circuit of FIG. 3. The analogue signal varies over a range of -480I to +480I, where I is a predetermined current that provides the smallest increment in the analogue signal (in this case given by approximately V/(8*R), where V is the voltage to which the tri-state buffer 22 drives the output pad 24 when it is switched on). This dynamic range of 960I would be linearly encoded with 10 bits. However, the logarithmic representation of the signal explained in relation to FIG. 1 achieves this dynamic range with 8 bits. Input digital signal values 00 to 1f (hexadecimal) are in the first chord 38 and provide thirty-two possible output analogue signal levels each spaced by I. The second chord 40 also provides thirty-two possible analogue signal levels, but this time spaced by 2*I. The same continues with the third chord 42 and the fourth chord 44 with respective analogue signal level spacings of 4*I and 8*I. When the most significant bit of the input digital signal value is "1", indicating a negative output analogue signal, then the corresponding negative chords 38', 40', 42' and 44' are used.

Whilst the dynamic range of the analogue signal is high, the resolution at higher levels is lower than with a conventional linear encoding. However, in many real life applications, such as audio signals, this is not significant since the logarithmic characteristic well matches the human hearing response and accordingly makes best use of the bit space available for the audio sample.

FIG. 5 illustrates the relationship between the chord selecting bits or exponent bits (EXP) and the chord-steering signals supplied to respective multiplexers 16 within differing output stages 10. The lowest order output stage is the one with the largest magnitude resistive element (in this case 8*R) and its selected output is represented by EN[0]. When the lowest chord 38, 38' is selected, then the lowest order output stage produces a pulse width modulated component with all the higher order stages being switched off. As the exponent increases, the output stage that produces the pulse width modulated signal moves up the order, with lower order output stages being permanently switched on and higher output stages remaining switched off. When the highest order chord 44, 44' is selected by the exponent value 11, then highest order output stage (corresponding to the resistive element R) produces a pulse width modulated signal and all of the lower order stages produce on signals.

FIGS. 6a and 6b illustrate the relationship between sign, exponent and mantissa bits of the input digital signal value to the component signals Iout[n] and the summed signal Itot that is low pass filtered. For those output stages that are producing a pulse width modulated signal, then the value given in FIGS. 6a and 6b is the duty cycle for a given mantissa multiplied by the relative signal amplitude for that stage.

Figure 7:
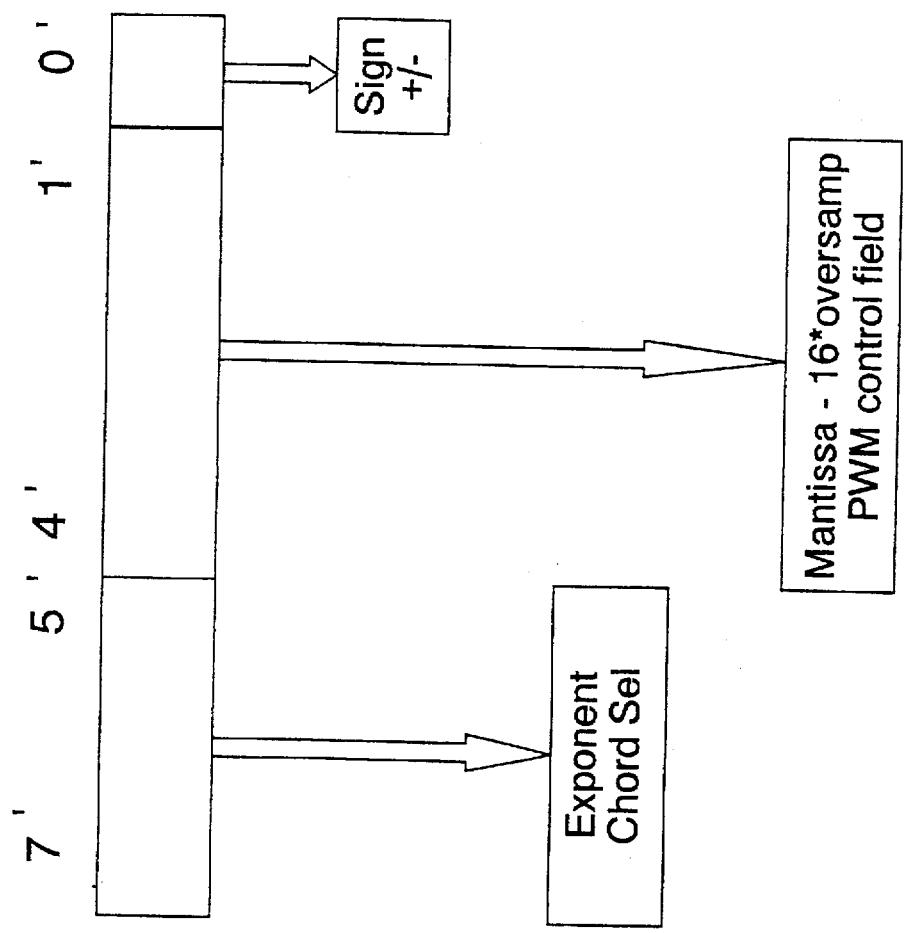
FIG. 7 illustrates the format of another embodiment of an input digital signal value.

FIGS. 7 to 13 illustrate a second embodiment of the invention. This embodiment operates on the same principals as the above described first embodiment, but in this case uses a 3-bit exponent (chord selection bits) and a 4-bit mantissa (control field bits). This is illustrated in FIG. 7.

Figure 8:
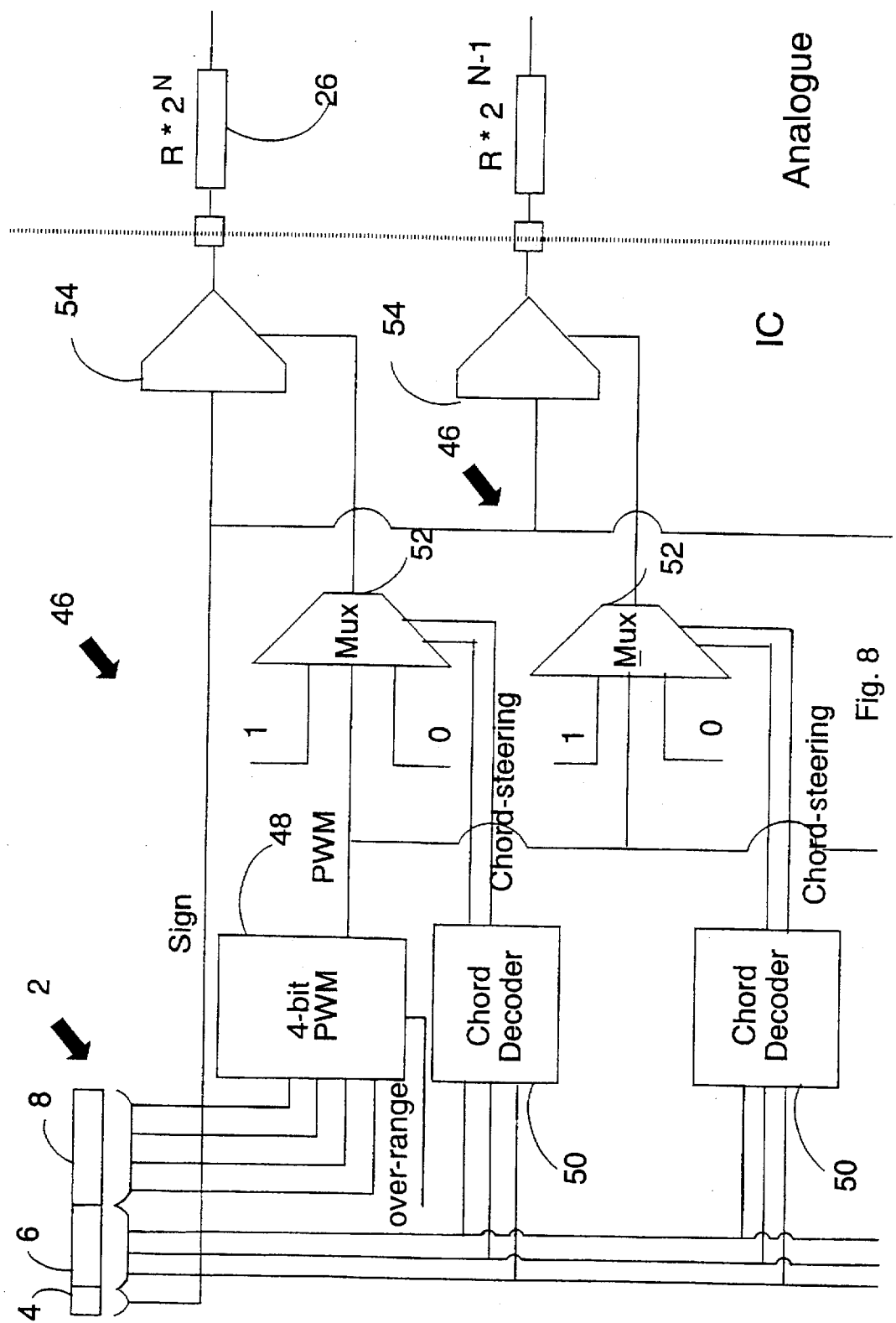
FIG. 8 illustrates two output stages for digital to analogue converting the input digital signal value of FIG. 7.

FIG. 8 shows two output stages 46 that in this case include a 4-bit pulse width modulated decoder 48 and a chord decoder 50 that is responsive to three exponent bits. The multiplexer 52 and the tri-state buffer 54 operate in the same manner as those previously described.

Figure 9:
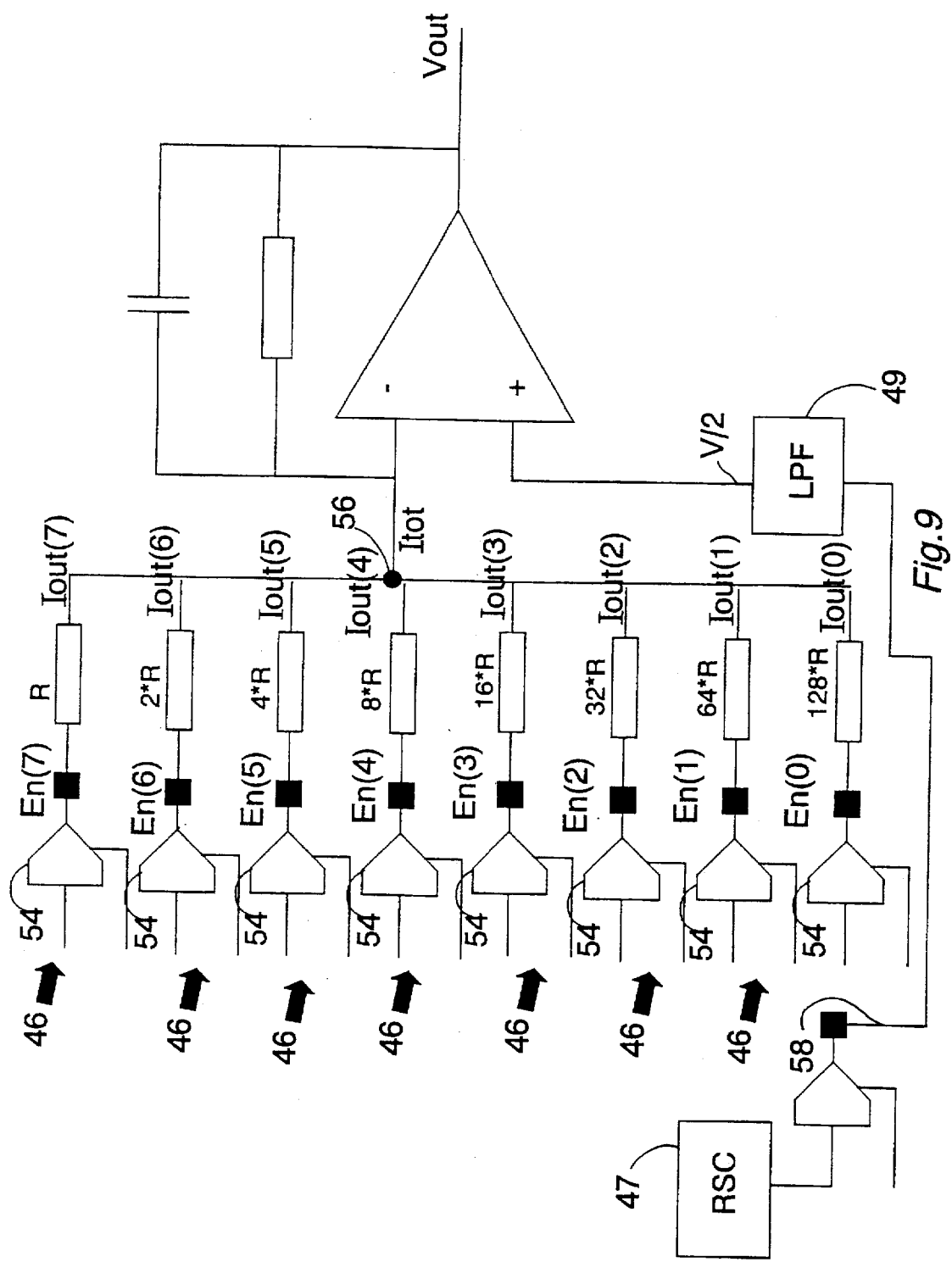
FIG. 9 illustrates the end portions, i.e., tristate buffers, of a set of output stages as illustrated in FIG. 8 in combination with a low pass filter.

FIG. 9 illustrates a digital to analogue converter composed of eight of the output stages 46 illustrated in FIG. 8. In this case, the resistive elements range in resistance value between R and 128*R. The output component signal currents from all of the output stages 46 are passed to the common summing node 56 before they are low pass filtered. The reference signal circuit 47 produces a 50% duty cycle reference signal that is then low pass filtered by the reference signal low pass filter 49.

Figure 10:
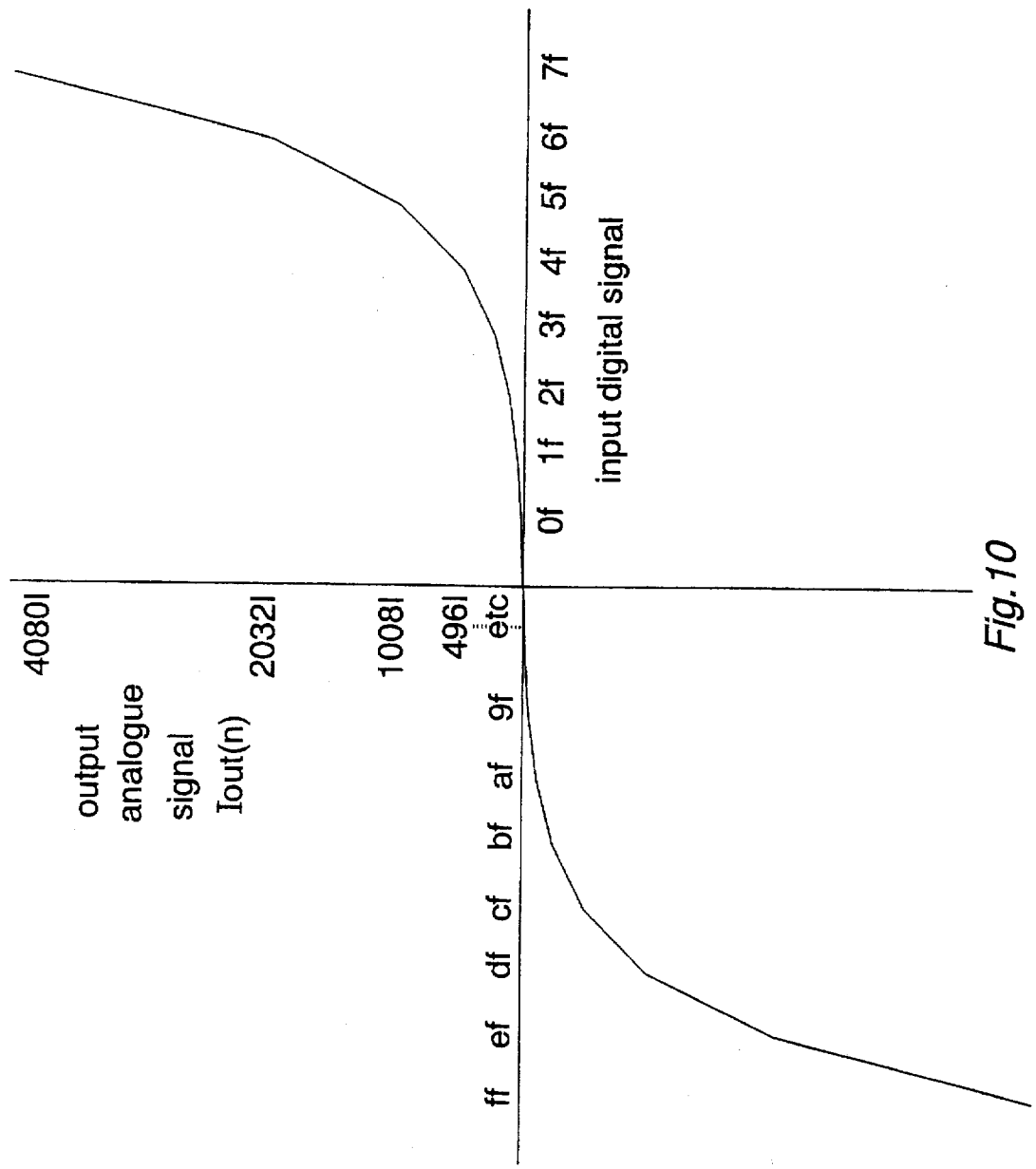
FIG. 10 illustrates the digital to analogue characteristic of the system of FIGS. 7, 8 and 9.

FIG. 10 illustrates the characteristic of the digital to analogue converter of FIG. 9. The characteristic is composed of eight chords that are respectively selected by differing exponent values. The highest values within respective chords are 16I, 48I, 112I, 240I, 496I, 1008I, 2032I and 4080I. The total dynamic range of the characteristic is 8160I. This dynamic range would normally require 13 bits to cover with a linear representation. In this logarithmic representation it is covered in only 8 bits at the expense of the step size increasing in the final chord to 128I. Each chord has sixteen possible equally spaced levels.

FIG. 11 illustrates the relationship between the exponent values and the chord-steering output of the chord decoder 50. The pattern of this relationship is the same as that illustrated in FIG. 5 for the previous embodiment. As the exponent increases, the output stage that is producing a pulse width modulated signal increases in order with the lower stages being switched on and the higher stages being switched off.

FIGS. 12a and 12b show the relationship between sign, exponent and mantissa bit to the component and total signals in the second embodiment. In comparison with the first embodiment, a higher dynamic range is achieved at the expense of a larger step size. This has been found to be a worthwhile trade-off in audio signal digital to analogue conversion.

FIG. 13 illustrates the relationship between the mantissa values and the pulse width modulated signal output by the 4-bit pulse width modulated decoder 48 of FIG. 8. A mantissa value of 1000 produces a duty cycle of 0/16 that is represented by the pulse width modulated signal remaining at the off state through all of its sixteen time slots (oversampling frequency *16). A mantissa value (control field bits) of 0000 produces a 8/16 (50%) duty cycle in which the pulse width modulated signal alternates between off and on between each of the sixteen over sampled time slots. It would be possible to achieve a 50% duty cycle by having eight consecutive off time slots followed by eight consecutive on time slots. However, such a decoding would have a greater low frequency Fourier component content that would be more difficult for the low pass filter to remove. Accordingly, in order to improve the fidelity of the analogue signal derived the highest frequency pattern is used.

In the embodiment of FIG. 8, the input digital signal values are subject to a degree of digital signal processing prior to being output. This digital signal processing can be used to compensate for factors such as a variation with frequency of the phase shift introduced by the digital to analogue converter. If a 100% duty cycle is required for the pulse width modulated signal, then this is achieved by supplying sample data to the digital signal processing preprocessing circuits that force these into an over-range condition with this over-range signal being supplied to the 4 bit pulse width modulated decoder 48. This is illustrated by the bottom line in FIG. 13.

Figure 14:
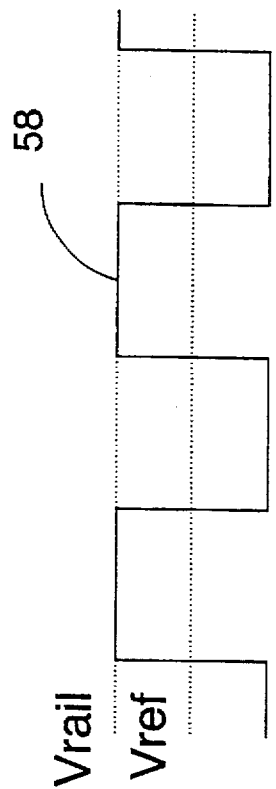
FIG. 14 illustrates the relationship between the reference signal of a predetermined duty cycle, the reference voltage and the supply/rail voltage.

FIG. 14 illustrates a reference signal 58 composed of a square wave with a 50% duty cycle and a level varying between zero and the supply voltage Vrail. The mean (low pass filtered) value of the reference signal is half the rail voltage and is supplied elsewhere in the circuit as the reference voltage.

Figure 15:
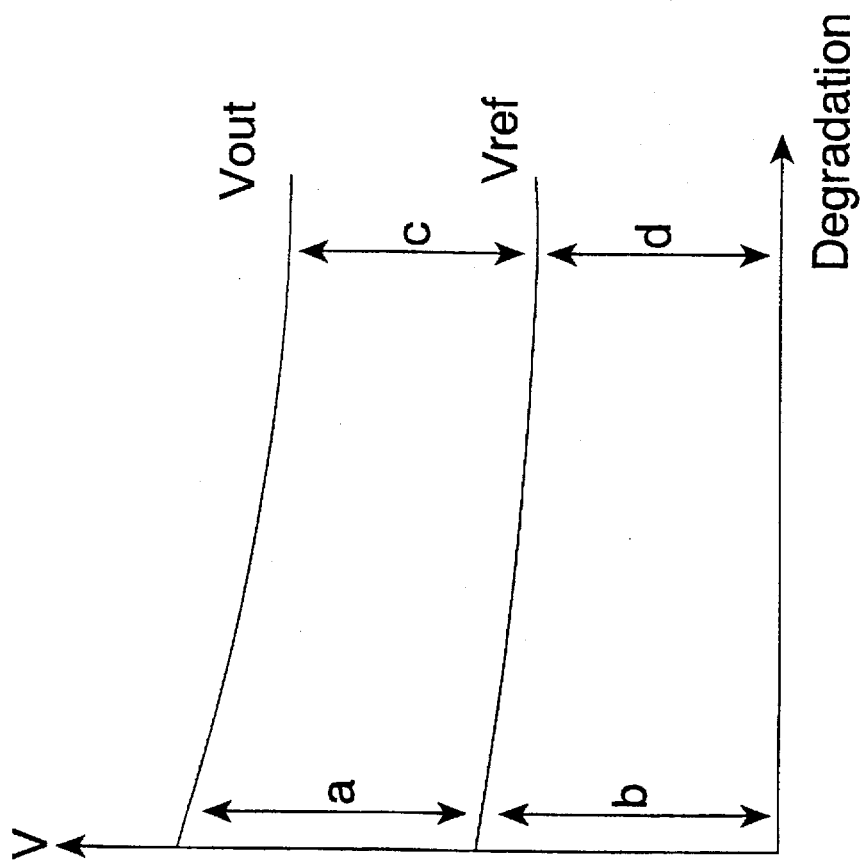
FIG. 15 illustrates the matching variation in the uncorrected analogue signal and the reference voltage.

FIG. 15 illustrates how the variation due to degradation in the uncorrected analogue signal (the common node signal) is matched by the variation in the reference voltage such that a/b is substantially the same as c/d. In this way voltage drift, offset and some other problems due to tolerances in the circuits may be corrected for by the differential amplifier supplied with the reference voltage as a reference input level.

Figure 16:
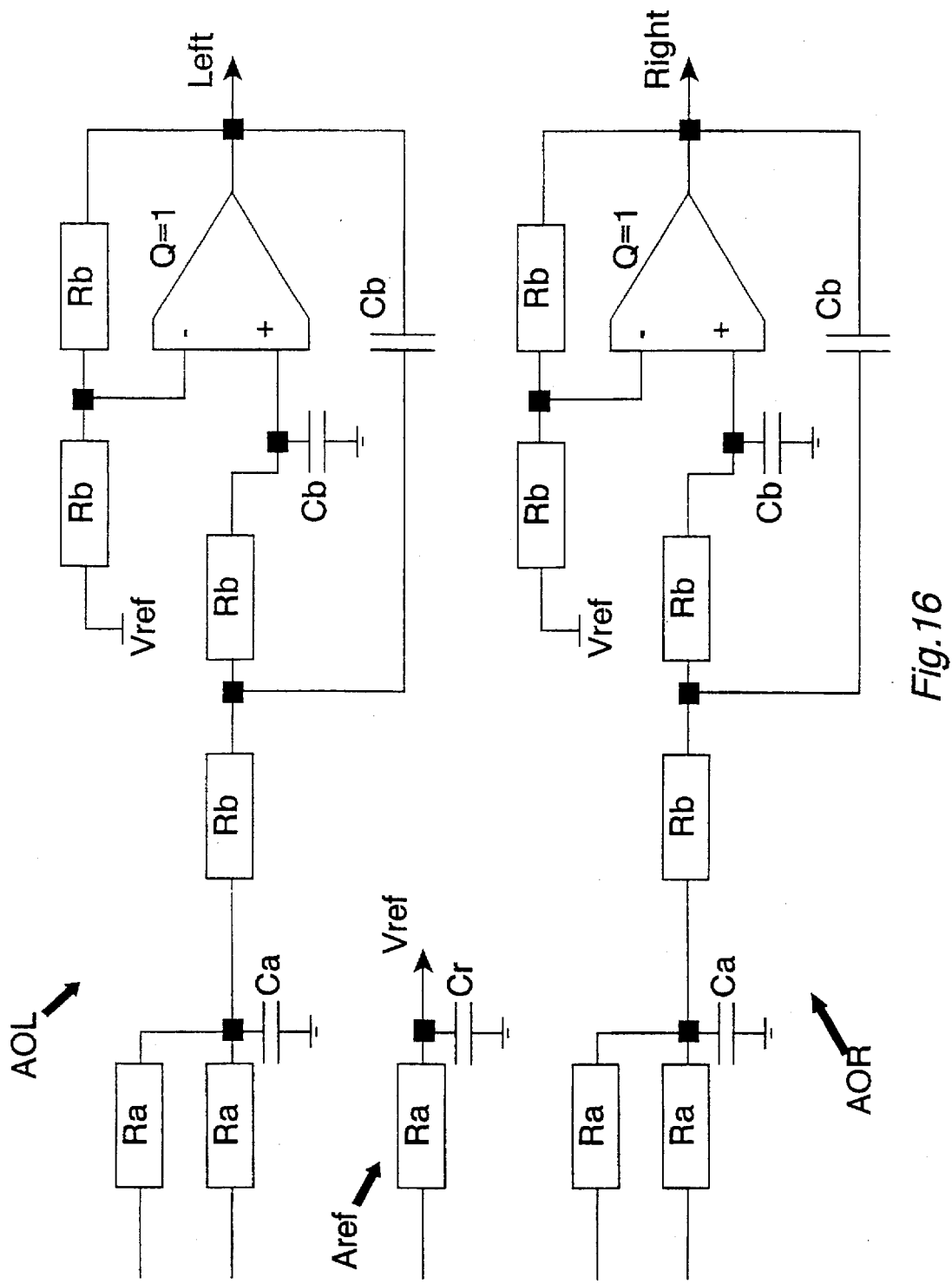
FIG. 16 illustrates another embodiment in which stereo audio signals are produced by two two-stage digital to analogue convertors and are then low pass filtered and amplified.

FIG. 16 illustrates another embodiment having two two-stage audio channels AOL, AOR each having an associated low pass filter and amplifier associated therewith. A reference voltage Vref is provided by an output Aref that is low pass filtered. This reference voltage Vref is supplied to the filter and amplifying circuits of both channels to compensate for variations in the signals AOL, AOR and Aref being produced by the integrated circuit.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A digital to analogue converter for converting an input digital signal value to an output analogue signal, said digital to analogue converter comprising:

(i) a plurality of output stages each being responsive to said input digital signal value to generate a component signal that is one of an on signal having a signal amplitude, a pulse width modulated signal having said signal amplitude and an off signal, said on signal and said pulse width modulated signal for different output stages having different signal amplitudes and being coupled in parallel to a common summing node to generate a sum signal; and (ii) a low pass filter for low pass filtering any pulse width modulated component of said sum signal at said common summing node to generate said output analogue signal wherein said input digital signal value includes at least one chord bit, said at least one chord bit controls which of said output stages generate said on signal, which of said output stages generate said pulse width modulated signal and which of said output stages generate said off signal, and for a given input digital signal value, only one of said output stages is a pulse width modulated output stage that generates a pulse width modulated signal, any output stages with signal amplitude lower than said pulse width modulated output stage generate on signals and any output stages with signal amplitude higher than said pulse width modulated output stage generate off signals.

2. A digital to analogue converter as claimed in claim 1, wherein said on signals and said pulse width modulated signals for different output stages have logarithmically related amplitudes.

3. A digital to analogue converter as claimed in claim 2, wherein said signal amplitudes increase by a factor of two between output values.

4. A digital to analogue converter as claimed in claim 1, wherein said low pass filter includes a differential amplifier, a reference input to said differential amplifier being a reference voltage derived from a reference signal of a predetermined duty cycle.

5. A digital to analogue converter as claimed in claim 1, wherein each output stage includes a resistive element to control said signal amplitudes for said output stage.

6. A digital to analogue converter as claimed in claim 5, wherein other than said resistive elements and said low pass filter, said digital to analogue converter comprises a digital integrated circuit.

7. A digital to analogue converter as claimed in claim 1, wherein said resistive elements are formed of one or more resistors having a common resistance value and originating from a common manufacturing batch.

8. A digital to analogue converter as claimed in claim 1, wherein each output stage includes a tri-state buffer that generates said component signal.

9. A digital to analogue converter as claimed in claim 1, wherein said input digital signal value is a digital audio sample and said output analogue signal drives an audio transducer.

10. A digital to analogue converter as claimed in claim 1, wherein said input digital signal value includes a plurality of control field bits, said plurality of control field bits selects a duty cycle for said pulse width modulated signal.

11. A digital to analogue converter for converting an input digital signal value to an output analogue signal, said digital to analogue converter comprising:
(i) a plurality of output stages each being responsive to said input digital signal value to generate a component signal that is one of an on signal having a signal amplitude, a pulse width modulated signal having said signal amplitude and an off signal, said on signal and said pulse width modulated signal for different output stages having different signal amplitudes and being coupled in parallel to a common summing node to generate a sum signal; and
(ii) a low pass filter for low pass filtering any pulse width modulated component of said sum signal at said common summing node to generate said output analogue signal
wherein said on signals and said pulse width modulated signals for different output stages having logarithmically related amplitudes
wherein said input digital signal value includes at least one chord bit, said at least one chord bit controls which of said output stages generate said on signal, which of said output stages generate said pulse width modulated signal and which of said output stages generate said off signal.

12. A digital to analogue converter as claimed in claim 11, wherein, for a given input digital signal value, only one of said output stages is a pulse width modulated output stage that generates a pulse width modulated signal, any output stages with signal amplitude lower than said pulse width modulated output stage generating on signals and any output stages with signal amplitude higher than said pulse width modulated output stage generating off signals.

13. A digital to analogue converter as claimed in claim 12, wherein said input digital signal value includes a plurality of control field bits, said plurality of control field bits selects a duty cycle for said pulse width modulated signal.

14. A digital to analogue converter for converting an input digital signal value to an output analogue signal, said digital to analogue converter comprising:
(i) a plurality of output stages each being responsive to said input digital signal value to generate a component signal that is one of an on signal having a signal amplitude, a pulse width modulated signal having said signal amplitude and an off signal, said on signal and said pulse width modulated signal for different output stages having different signal amplitudes and being coupled in parallel to a common summing node to generate a sum signal; and
(ii) a low pass filter for low pass filtering any pulse width modulated component of said sum signal at said common summing node to generate said output analogue signal
wherein said input digital signal value includes a sign bit, said sign bit selects the polarity of said output analogue signal.

15. A digital to analogue converter for converting an input digital signal value to an output analogue signal, said digital to analogue converter comprising:
(i) a plurality of output stages each being responsive to said input digital signal value to generate a component signal that is one of an on signal having a signal amplitude, a pulse width modulated signal having said signal amplitude and an off signal, said on signal and said pulse width modulated signal for different output stages having different signal amplitudes and being coupled in parallel to a common summing node to generate a sum signal; and
(ii) a low pass filter for low pass filtering any pulse width modulated component of said sum signal at said common summing node to generate said output analogue signal
wherein said pulse width modulated signal has a highest frequency pattern for a required duty cycle and oversampling frequency of said pulse width modulated signal.

16. A digital to analogue conversion method for converting an input digital signal value to an output analogue signal, said digital to analogue conversion method comprising the steps of:
(i) in response to said input digital signal value in each of a plurality of output stages generating a component signal that is one of an on signal having a signal amplitude, a pulse width modulated signal having said signal amplitude and an off signal, said on signal and said pulse width modulated signal for different output stages having different signal amplitudes and being coupled in parallel to a common summing node generating a sum signal; and
(ii) low pass filtering any pulse width modulated component of said sum signal at said common summing node to generate said output analogue signal
wherein said input digital signal value includes at least one chord bit, said at least one chord bit controlling which of said output stages generate said on signal, which of said output stages generate said pulse width modulated signal and which of said output stages generate said off signal
wherein, for a given input digital signal value, only one of said output stages is a pulse width modulated output stage that generates a pulse width modulated signal any output stages with signal amplitude lower than said pulse width modulated output stage generate on signals and any output stages with signal amplitude higher than said pulse width modulated output stage generate off signals.

\* \* \* \* \*